United States Patent
Yin et al.

(10) Patent No.: US 12,334,913 B2
(45) Date of Patent: Jun. 17, 2025

(54) DRMOS, INTEGRATED CIRCUIT, ELECTRONIC DEVICE, AND PREPARATION METHOD

(71) Applicant: HUAWEI TECHNOLOGIES CO., LTD., Guangdong (CN)

(72) Inventors: Fayou Yin, Shenzhen (CN); Boning Huang, Dongguan (CN); Wentao Yang, Dongguan (CN); Quan Zhang, Shenzhen (CN); Qian Zhao, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/170,575

(22) Filed: Feb. 17, 2023

(65) Prior Publication Data

US 2023/0198512 A1 Jun. 22, 2023

Related U.S. Application Data

(63) Continuation of application No. PCT/CN2020/110072, filed on Aug. 19, 2020.

(51) Int. Cl.
*H03K 17/0412* (2006.01)
*H03K 17/16* (2006.01)

(52) U.S. Cl.
CPC ..... *H03K 17/04123* (2013.01); *H03K 17/162* (2013.01)

(58) Field of Classification Search
CPC .......... H03K 17/04123; H03K 17/162
See application file for complete search history.

(56) References Cited

U.S. PATENT DOCUMENTS

| | | | |
|---|---|---|---|
| 6,351,018 B1* | 2/2002 | Sapp | H10D 64/117 |
| | | | 438/179 |
| 7,145,316 B1* | 12/2006 | Galinski, III | H02M 1/08 |
| | | | 323/283 |

(Continued)

FOREIGN PATENT DOCUMENTS

| CN | 1641887 A | * | 7/2005 | ............. | H01L 27/04 |
|---|---|---|---|---|---|
| JP | 2002217416 A | | 8/2002 | | |

(Continued)

OTHER PUBLICATIONS

Extended European Search Report dated Sep. 12, 2023, issued for European Application No. 20949809.6 (11 pages).

(Continued)

*Primary Examiner* — Menatoallah Youssef
*Assistant Examiner* — Khareem E Almo

(57) ABSTRACT

A driver metal-oxide-semiconductor field-effect transistor DrMOS, an integrated circuit, an electronic device, and a preparation method are provided. The DrMOS mainly includes a first die and a second die. The first die includes a drive circuit and a first switching transistor, and the drive circuit is connected to a gate of the first switching transistor. The second die includes a second switching transistor, and the drive circuit is connected to a gate of the second switching transistor through a first conductor. The drive circuit and the first switching transistor are prepared in a same die. This helps to reduce an area, loss, and costs of the DrMOS. The first switching transistor and the second switching transistor are prepared in different dies that reduces type selection limitation.

19 Claims, 9 Drawing Sheets

(56) References Cited

U.S. PATENT DOCUMENTS

| | | | |
|---|---|---|---|
| 8,168,490 B2 | 5/2012 | Hebert | |
| 8,193,570 B2 * | 6/2012 | Sapp | H10D 84/141 |
| | | | 438/243 |
| 9,601,453 B2 * | 3/2017 | Hebert | H10D 30/664 |
| 9,882,481 B2 * | 1/2018 | Mascioli | H02M 1/36 |
| 11,469,670 B2 * | 10/2022 | Pahkala | H02M 3/157 |
| 2005/0173758 A1 | 8/2005 | Peake et al. | |
| 2009/0072368 A1 | 3/2009 | Hu et al. | |
| 2010/0171543 A1 | 7/2010 | Korec et al. | |
| 2011/0227169 A1 | 9/2011 | Uno et al. | |
| 2011/0269286 A1 | 11/2011 | Zuniga et al. | |
| 2013/0256859 A1 | 10/2013 | Cho et al. | |
| 2015/0263626 A1 | 9/2015 | Mao et al. | |
| 2016/0172283 A1 | 6/2016 | Cho | |
| 2017/0236931 A1 | 8/2017 | Meiser et al. | |
| 2022/0045207 A1 * | 2/2022 | Fang | H01L 29/41766 |
| 2023/0421049 A1 * | 12/2023 | Neidorff | H02M 3/158 |

FOREIGN PATENT DOCUMENTS

| | | | |
|---|---|---|---|
| JP | 2006280100 A | 10/2006 | |
| JP | 2020013942 A | 1/2020 | |

OTHER PUBLICATIONS

Office Action dated May 21, 2024, issued for Japanese Application No. 2023-512098 (16 pages) and Translation.

\* cited by examiner

DRMOS, INTEGRATED CIRCUIT, ELECTRONIC DEVICE, AND PREPARATION METHOD

CROSS-REFERENCE TO RELATED APPLICATIONS

This application is a continuation of International Application No. PCT/CN2020/110072, filed on Aug. 19, 2020, the disclosure of which is hereby incorporated by reference in its entirety.

TECHNICAL FIELD

This disclosure relates to the field of semiconductor technologies, and in particular, to a DrMOS, an integrated circuit, an electronic device, and a preparation method.

BACKGROUND

A driver metal-oxide-semiconductor field-effect transistor (DrMOS) is a device integrating a drive circuit and a plurality of switching transistors, and is widely used in an integrated circuit integrating a drive circuit and a switching power supply circuit.

Specifically, a switching power supply circuit usually includes a plurality of switching transistors, a drive circuit is connected to each of the plurality of switching transistors in the switching power supply circuit, and the drive circuit may control switch-on and switch-off of each switching transistor to adjust an output current and/or an output voltage of the switching power supply circuit. In an integrated circuit, a drive circuit and a plurality of switching transistors in a switching power supply circuit may be integrated into one device (namely, a DrMOS). In this case, a connection line between the drive circuit and each switching transistor is short. This helps to reduce an area of the integrated circuit and increase a power density of the integrated circuit.

However, most of current DrMOSs are die co-package structures, the drive circuit and the plurality of switching transistors are respectively located in independent dies, and different switching transistors are located in different dies. A die including the drive circuit is connected, through a lead, to each of a plurality of dies including the switching transistors. Based on this implementation, a manufacturing process is complex, and costs are high. In addition, an integration of a die co-package structure is not high, and an area of a DrMOS needs to be further reduced. Moreover, excessive leads also lead to problems such as parasitic inductance, parasitic capacitance, and parasitic resistance, increasing a loss of the DrMOS.

In conclusion, a current DrMOS needs to be further studied.

SUMMARY

This disclosure provides a DrMOS, an integrated circuit, an electronic device, and a preparation method, to reduce an area, costs, and a loss of a DrMOS.

According to a first aspect, an embodiment of this disclosure provides a DrMOS, mainly including a first die and a second die. The first die includes a drive circuit and a first switching transistor, and the drive circuit is connected to a gate of the first switching transistor. The second die includes a second switching transistor, and the drive circuit is connected to a gate of the second switching transistor through a first conductor.

For example, the drive circuit may be connected to the gate of the first switching transistor through a metal cable in the first die, in other words, the first die includes the metal cable between the drive circuit and the first switching transistor. In this case, no additional lead is required to implement the connection between the drive circuit and the first switching transistor. Therefore, this helps to simplify a DrMOS preparation process and reduce process costs of the DrMOS. In addition, leads in the DrMOS may be reduced, thereby helping to alleviate problems such as parasitic inductance, parasitic capacitance, and parasitic resistance caused by the leads, and further helping to reduce a loss of the DrMOS. In addition, the drive circuit and the first switching transistor are prepared in a same die (the first die), so that the drive circuit and the first switching transistor are closer to each other. This helps to reduce an area of the DrMOS.

In addition, in the DrMOS provided in this embodiment of this disclosure, the first switching transistor and the second switching transistor are prepared in different dies. Therefore, a problem of preparation process compatibility between the first switching transistor and the second switching transistor does not need to be considered. This helps to reduce type selection limitation on the first switching transistor and the second switching transistor. Types of the first switching transistor and the second switching transistor may be flexibly selected based on an application scenario. Moreover, the drive circuit is connected to the second switching transistor through the first conductor, so that the drive circuit can maintain a capability of controlling the second switching transistor.

It may be understood that the DrMOS provided in this embodiment of this disclosure may be applied to implementation of a plurality of types of switching power supply circuits. In some switching power supply circuits, for example, a buck circuit, a source of the first switching transistor is connected to a drain of the second switching transistor. To adapt to such a circuit, in the DrMOS provided in this embodiment of this disclosure, the source of the first switching transistor may be connected to the drain of the second switching transistor through a second conductor.

Next, an application of the DrMOS in the buck circuit is used as an example to further describe the DrMOS provided in this embodiment of this disclosure. When the DrMOS is used in the buck circuit, the first switching transistor in the DrMOS may be a drive switching transistor in the buck circuit, the second switching transistor in the DrMOS may be a rectifier switching transistor in the buck circuit, and the drive circuit in the DrMOS may be a drive circuit in the buck circuit.

According to a working principle of the buck circuit, the following conclusion may be drawn: The first switching transistor may be implemented by a transistor with a high switching speed. This helps to reduce a loss of the first switching transistor. For example, the first switching transistor may be an LDMOS transistor. The second switching transistor may be implemented by using a transistor with a small on-resistance. This helps to reduce a loss of the second switching transistor. For example, the second switching transistor may be an SGT MOS transistor.

Because a source and a drain of the SGT MOS transistor are respectively located on two surfaces opposite to each other, to simplify a connection between the first switching transistor and the second switching transistor, the SGT MOS transistor may be fastened onto a surface of a substrate by using a flip chip structure. Specifically, the DrMOS may further include the substrate. The substrate may carry the first die and the second die; a first surface of the first die is disposed away from the substrate, and the first surface is a surface that is in the first die and on which the source of the first switching transistor is located; a second surface of the second die is disposed away from the substrate, and the second surface is a surface that is in the second die and on which the drain of the second switching transistor is located; and the source of the first switching transistor is connected to the drain of the second switching transistor through the second conductor.

The second die is fastened onto the surface of the substrate in a flip-chip manner, so that the drain of the second switching transistor can be exposed, and a source of the second switching transistor can in direct contact with the substrate. In this case, the drain of the second switching transistor may be connected to the source of the first switching transistor through a lead, and the source of the second switching transistor may be grounded through a metal wire on the substrate.

To further reduce a loss of the DrMOS, in a possible implementation, the second die may further integrate a Schottky barrier diode SBD. An anode of the SBD is connected to the source of the second switching transistor, and a cathode of the SBD is connected to the drain of the second switching transistor.

The SBD has a low conduction voltage drop VF and a small reverse recovery charge Qrr. This helps to further reduce a loss of the second die. The conduction voltage drop VF is used as an example. There is a dead time between a charging stage and a rectification stage due to a specific delay between switch-on and switch-off of a switching transistor. The second switching transistor is not fully switched on during the dead time. In this case, a current may be transmitted through the SBD in parallel with the second switching transistor. Because a conduction voltage drop VF of the SBD is low, this helps to reduce a loss generated in a process in which the SBD transmits the current, helping to further reduce the loss of the second die.

It may be understood that, in addition to the drive circuit, the first switching transistor, and the second switching transistor, another structure may be integrated into the DrMOS provided in this embodiment of this disclosure, to implement more functions. For example, the DrMOS may further include a temperature sensor, and an external component may obtain temperature information of the DrMOS by using the temperature sensor.

For another example, the DrMOS may further include a current sensor, and the external component may detect, by using the current sensor, a magnitude of a current flowing through the first switching transistor when the first switching transistor is switched on. For example, the current sensor may be integrated in the first die.

According to a second aspect, an embodiment of this disclosure further provides an integrated circuit. The integrated circuit may include the DrMOS provided in any implementation of the first aspect. For a technical effect of a corresponding solution in the second aspect, refer to the technical effect that can be achieved by the corresponding solution in the first aspect. Details are not described herein again.

For example, in addition to the DrMOS, the integrated circuit may include an inductor and a capacitor. The first switching transistor and the second switching transistor in the DrMOS, and the inductor and the capacitor may form a buck circuit. One end of the inductor is connected to the source of the first switching transistor, the other end of the inductor is connected to one end of the capacitor, the other end of the inductor is configured to output an output voltage, and the source of the second switching transistor and the other end of the capacitor are grounded.

According to a third aspect, an embodiment of this disclosure further provides an electronic device. The electronic device may include the integrated circuit provided in any implementation of the second aspect. For example, the electronic device may be a smartphone, a personal computer, an intelligent driving vehicle, a router, or a switch. A chip is installed in the electronic device. The integrated circuit provided in this embodiment of this disclosure can supply power to the chip in the electronic device.

According to a fourth aspect, an embodiment of this disclosure further provides a DrMOS preparation method. The method may be used to prepare the DrMOS provided in any embodiment of the first aspect. For example, the DrMOS preparation method mainly includes the following steps: separately preparing a first die and a second die; and connecting a drive circuit to a gate of a second switching transistor through a first conductor, where the first die includes the drive circuit and a first switching transistor, the drive circuit is connected to a gate of the first switching transistor, and the second die includes the second switching transistor. For example, the first die may be prepared by using a bipolar junction transistor-complementary metal oxide semiconductor-diffused metal oxide semiconductor (BCD) process, so that the first die may integrate the drive circuit and the first switching transistor, and the drive circuit is connected to the gate of the first switching transistor. The second switching transistor may also be prepared by using the BCD process. This is not limited in this embodiment of this disclosure.

In some switching power supply circuits, a source of the first switching transistor may also be connected to a drain of the second switching transistor. In this case, the source of the first switching transistor in the first die may also be connected to the drain of the second switching transistor in the second die by using a second conductor. In this way, the DrMOS can adapt to this type of switching power supply circuit.

A buck circuit is used as an example. In this embodiment of this disclosure, the first switching transistor may be used as a driving switching transistor in the buck circuit, and the second switching transistor may be used as a rectifier switching transistor in the buck circuit. In this case, the first switching transistor may be implemented by a transistor with a high switching speed. For example, the first switching transistor may be an LDMOS transistor. The second switching transistor may be implemented by a transistor with a small on-resistance. For example, the second switching transistor may be an SGT MOS transistor.

When the DrMOS is used in the buck circuit, in the DrMOS, the source of the first switching transistor needs to be connected to the drain of the second switching transistor. Specifically, after the first die and the second die are separately prepared, the first die and the second die may be first fastened onto a same surface of a substrate, and then the drive circuit is connected to the gate of the second switching transistor by using the first conductor.

During fastening of the first die, a first surface of the first die may be disposed away from the substrate, and the first surface may be a surface on which a source of the first switching transistor (LDMOS transistor) is located. During fastening of the second die, a second surface of the second die may be disposed away from the substrate, and the second surface may be a surface on which the drain of the second switching transistor (SGT MOS transistor) is located. Further, the source of the first switching transistor may be directly connected to the drain of the second switching transistor through the second conductor. The second conductor may be a lead or a conductor clip. This is not limited in this embodiment of this disclosure.

To further reduce a loss of the second switching transistor, in a possible implementation, the second die may further include a Schottky barrier diode SBD. An anode of the SBD is connected to a source of the second switching transistor, and a cathode of the SBD is connected to the drain of the second switching transistor. The SBD has a low conduction voltage drop VF and a small reverse recovery charge Qrr. This helps to reduce a loss of the second switching transistor generated in a dead time.

These aspects or other aspects of this disclosure are clearer and more comprehensible in descriptions of the following embodiments.

DESCRIPTION OF EMBODIMENTS

To make objectives, technical solutions, and advantages of this disclosure clearer, the following further describes this disclosure in detail with reference to the accompanying drawings. A specific operation method in a method embodiment may also be applied to an apparatus embodiment or a system embodiment. It should be noted that "at least one" in the description of this disclosure means one or more, and "a plurality of" means two or more. In view of this, "a plurality of" may also be understood as "at least two" in embodiments of the present invention. The term "and/or" describes an association relationship for describing associated objects and represents that three relationships may exist. For example, A and/or B may represent the following three cases: Only A exists, both A and B exist, and only B exists. In addition, the character "/" generally indicates an "or" relationship between the associated objects. In addition, it should be understood that in description of this disclosure, terms such as "first" and "second" are merely used for distinguishing and description, but should not be understood as indicating or implying relative importance, or should not be understood as indicating or implying a sequence. In embodiments of this disclosure, a "die" may be understood as a chip that has a specific function and that is cut from a wafer.

Figure 1:
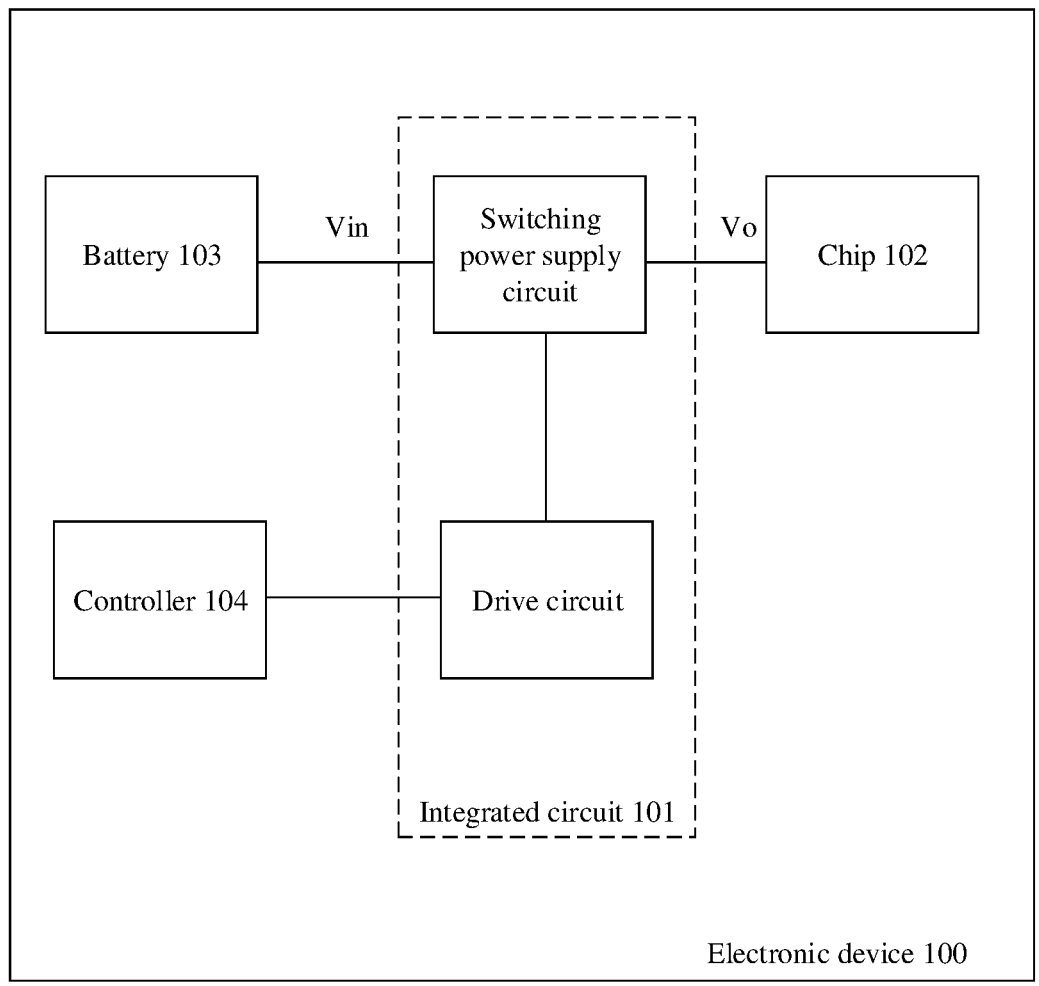
FIG. 1 is a schematic diagram of a structure of an electronic device.

In a modern electronic device, an integrated circuit with a voltage modulation capability usually needs to be disposed on a periphery of a chip, to provide a voltage that meets a working requirement of the chip to the chip. As shown in FIG. 1, an electronic device 100 includes an integrated circuit 101 and a chip 102. The electronic device 100 may be a smartphone, a personal computer, an intelligent driving vehicle, a router, a switch, or the like. The integrated circuit 101 may receive an input voltage. The input voltage may be provided by a battery 103 in the electronic device 100, or may be provided by a power supply located outside the electronic device 100. This is not limited in this embodiment of this disclosure.

The chip 102 may be a chip or a circuit in the electronic device 100, for example, a processor chip, a power management chip, a charging chip, or a field programmable gate array (FPGA). This is not listed one by one. The integrated circuit 101 may modulate the received input voltage Vin to provide an output voltage Vo that meets a working requirement of the chip 102 to the chip 102.

Generally, the integrated circuit 101 mainly includes a drive circuit and a switching power supply circuit. For example, the switching power supply circuit may be a boost circuit, a buck circuit, a direct current-to-direct current conversion circuit, an alternating current-to-direct current conversion circuit, and the like. This is not limited in this embodiment of this disclosure. Under the control of the drive circuit, the switching power supply circuit may modulate the received input voltage to output an output voltage that can meet the working requirement of the chip 102.

Specifically, the electronic device 100 may further include a controller 104. The controller 104 may send a control instruction to the drive circuit in the integrated circuit 10. The control instruction may be an instruction for indicating the integrated circuit 101 to adjust the output voltage Vo, an instruction for indicating the integrated circuit 101 to start or stop working, or the like. This is not limited in this embodiment of this disclosure.

The drive circuit may further adjust, based on the received control instruction, a drive signal provided for the switching power supply circuit. For example, the drive circuit may adjust a duty cycle of the drive signal, a signal frequency of the drive signal, and the like, to adjust the output voltage Vo.

Figure 2:
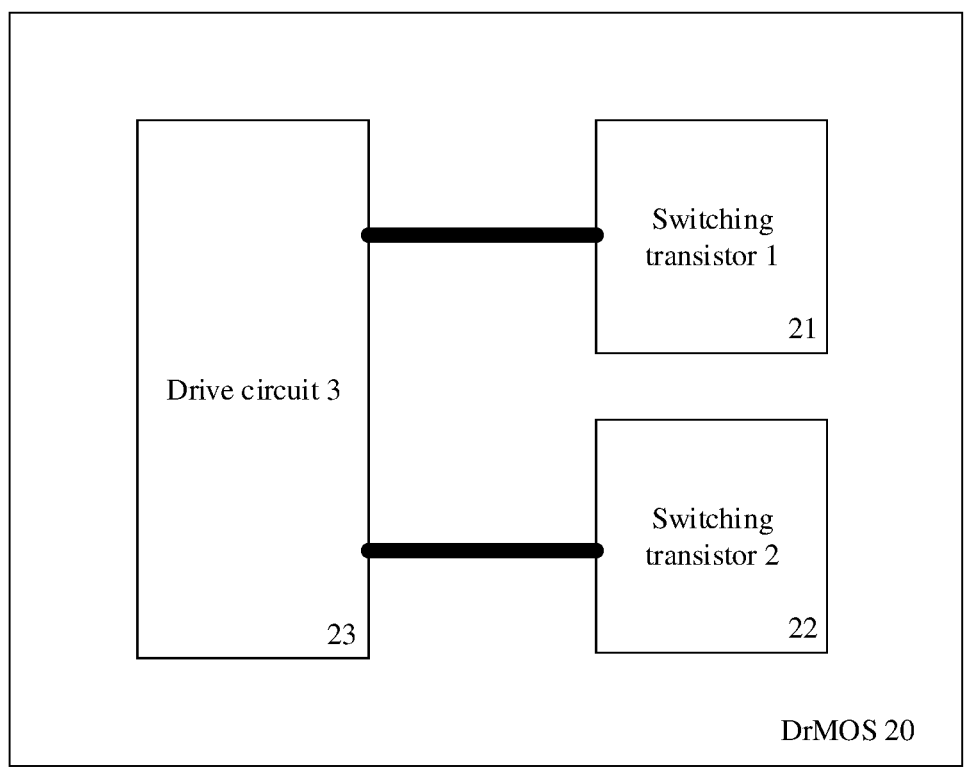
FIG. 2 is a schematic diagram of a structure of a DrMOS.

As a requirement for an integration of the electronic device 100 increases, a DrMOS is widely used in the integrated circuit 101 because of its advantage of a small area. FIG. 2 shows an example of a common DrMOS structure. As shown in FIG. 2, a DrMOS 20 mainly includes a die 21, a die 22, and a die 23. A switching transistor 1 is prepared in the die 21, a switching transistor 2 is prepared in the die 22, and a drive circuit is prepared in the die 23. The die 21, the die 22, and the die 23 are of a three-die co-package structure. To be specific, leads are connected between the die 23 and the die 21 and between the die 23 and the die 22, and a drive circuit 3 may be connected to a gate of each of the switching transistor 1 and the switching transistor 2 through the leads.

The integrated circuit 101 includes a switching power supply circuit and the drive circuit. The switching transistor 1 and the switching transistor 2 in the DrMOS 20 shown in FIG. 2 may be used as switching transistors in the switching power supply circuit, and the drive circuit 3 may be used as a drive circuit of the switching power supply circuit.

Figure 3:
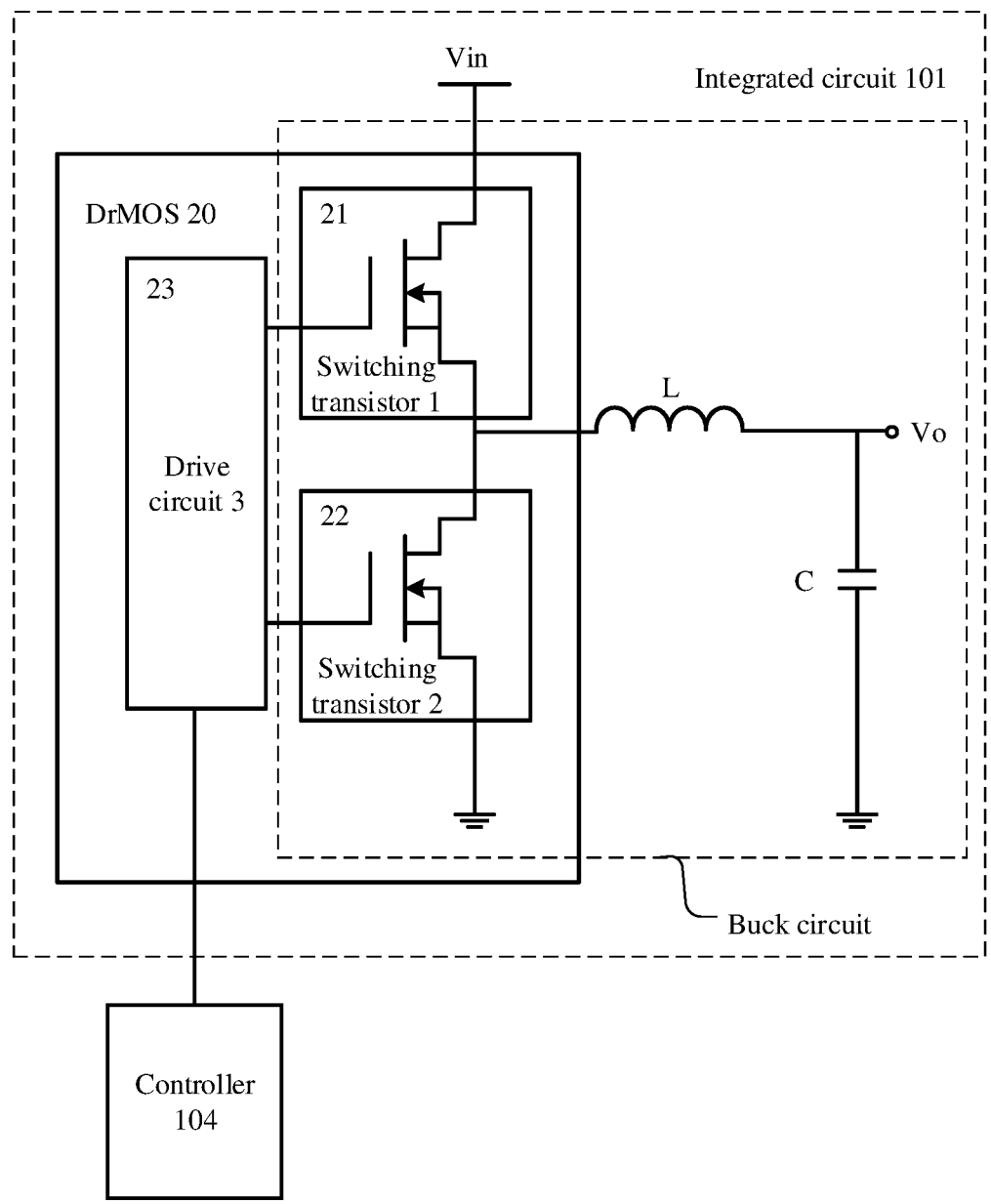
FIG. 3 is a schematic diagram of a structure of an integrated circuit.

A buck circuit is used as an example. As shown in FIG. 3, the buck circuit mainly includes a switching transistor 1, a switching transistor 2, an inductor L, and a capacitor C. A drain of the switching transistor 1 is configured to receive an input voltage Vin, and a source of the switching transistor 1 is connected to both a drain of the switching transistor 2 and one end of the inductor L. The other end of the inductor L is connected to one end of the capacitor C, and the other end of the inductor L may output an output voltage Vo. A source of a rectifier switching transistor L and the other end of the capacitor C are grounded.

A gate of the switching transistor 1 and a gate of the switching transistor 2 each are connected to the drive circuit 3. The drive circuit 3 may apply a drive signal to each of the gate of the switching transistor 1 and the gate of the switching transistor 2, to control switch-on and switch-off of the switching transistor 1 and the switching transistor 2, and further control the buck circuit to complete voltage conversion. For example, when the drive circuit 3 applies a high-level drive signal to the switching transistor 1, the switching transistor 1 may be switched on; and when the drive circuit 3 applies a low-level drive signal to the switching transistor 2, the switching transistor 1 may be switched off. This is the same with the switching transistor 2. Details are not described herein again.

Specifically, the buck circuit is a direct current-direct current buck circuit. To be specific, the input voltage Vin and the output voltage Vo each are a direct current voltage, and the output voltage Vo is less than the input voltage Vin. A voltage reduction process of the buck circuit is mainly divided into a charging stage and a rectification stage. Next, the charging stage and the rectification stage are described separately by using a drive signal shown in FIG. 4 as an example. A drive signal 1 is a drive signal provided by the drive circuit 3 for the switching transistor 1, and a drive signal 2 is a drive signal provided by the drive circuit 3 for the switching transistor 2.

Figure 4:
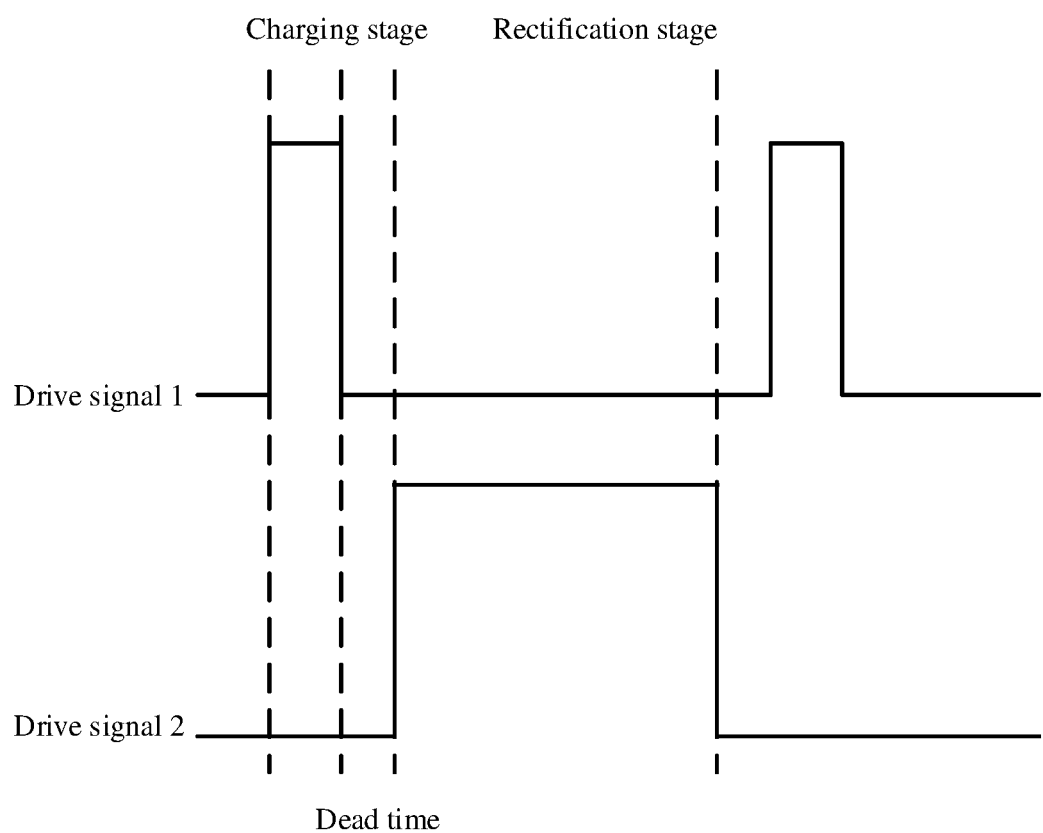
FIG. 4 is a schematic diagram of a drive signal of a buck circuit.

It may be understood that, in FIG. 4, both the switching transistor 1 and the switching transistor 2 may be switched on when a drive signal is at a high level and switched off when a drive signal is at a low level. In actual implementation, alternatively, the switching transistor 1 and the switching transistor 2 may be switched on when a drive signal is at a high level and switched off when a drive signal is at a low level. This is not limited in this embodiment of this disclosure.

1. Charging Stage

In the charging stage, the drive circuit 3 may switch on the switching transistor 1 and switch off the switching transistor 2. The switching transistor 1 may also be referred to as a driving switching transistor or an upper transistor. A current is input from the drain of the switching transistor 1, and is output after passing through the switching transistor 1 and the inductor L. In this process, the inductor L performs charging, and the inductor L converts electric energy into magnetic energy for storage. In the charging process of the inductor L, the inductor L may be used as a load to generate a voltage drop, so that an output voltage Vo of the buck circuit is lower than an input voltage Vin. With the extension of the charging process of the inductor L, the voltage drop generated by the inductor L gradually decreases, and the output voltage Vo gradually increases.

2. Rectification Stage

In the rectification stage, the drive circuit 3 may switch off the switching transistor 1 and switch on the switching transistor 2. The switching transistor 2 may also be referred to as a rectifier switching transistor or a lower transistor. The magnetic energy stored in the inductor L is converted into electric energy and released, in other words, the inductor L performs discharging. When the inductor L performs discharging, the output voltage Vo approaches an inductance voltage of the inductor L. With extension of the discharging process of the inductor L, the inductance voltage of the inductor L decreases gradually, and the output voltage Vo decreases gradually.

The drive circuit 3 may control the switching transistor 1 and the switching transistor 2 to be switched on and off, to control the buck circuit to alternately perform the charging stage and the rectification stage, so that the buck circuit continuously outputs the output voltage Vo. As shown in FIG. 3, the buck circuit further includes a capacitor C. The capacitor C may filter the output voltage Vo to reduce pulsation of the output voltage Vo and improve stability of the output voltage Vo.

As shown in FIG. 3, the switching transistor 1, the switching transistor 2, and the drive circuit 3 in the buck circuit may be implemented by using the DrMOS 20. In other words, the switching transistor 1, the switching transistor 2, and the drive circuit 3 may be integrated in a same DrMOS 20. Further, the switching transistor 1, the switching transistor 2, and the drive circuit 3 are closer to each other. This helps to reduce an area of the integrated circuit 101 and increase a power density of the integrated circuit 101.

However, because the DrMOS 20 is of a three-die co-package structure, there is still a gap between every two of the switching transistor 1, the switching transistor 2, and the drive circuit 3, an area of the DrMOS 20 is large, and an integration is not high. In addition, the switching transistor 1, the switching transistor 2, and the drive circuit 3 need to be electrically connected by using leads. In this case, a preparation process is complex, increasing costs of the DrMOS 20. Finally, because the dies in the DrMOS 20 need to be connected to each other by using leads, there are a large quantity of leads in the DrMOS 20, further leading to problems such as parasitic inductance, parasitic capacitance, and parasitic resistance and increasing a loss of the DrMOS 20.

Figure 5:
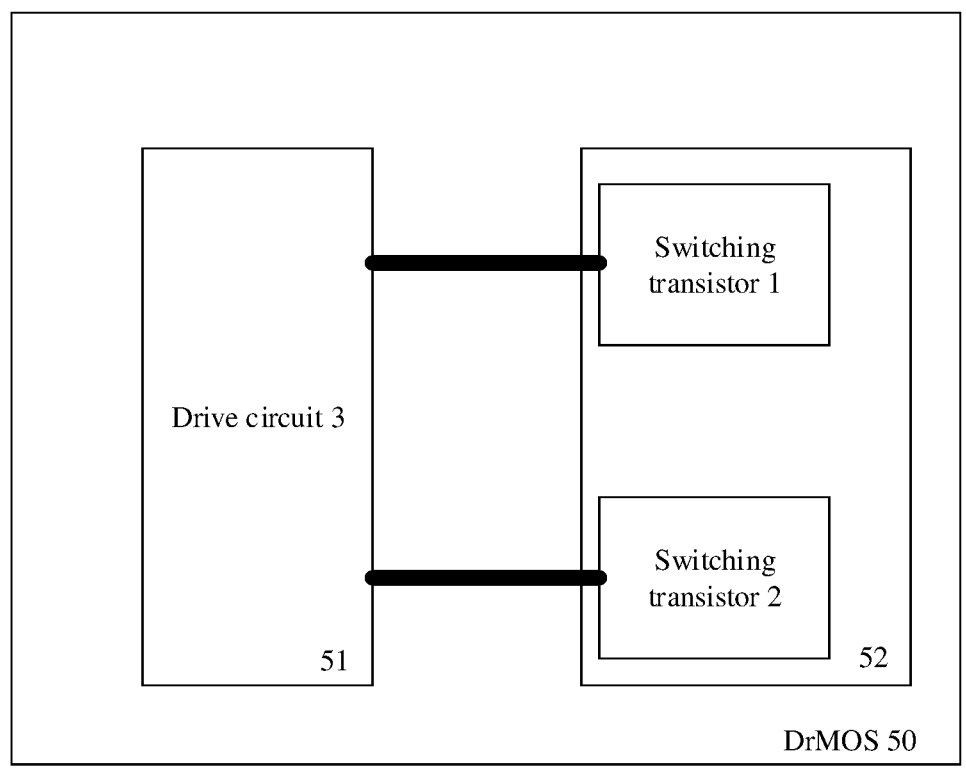
FIG. 5 is a schematic diagram of a structure of a DrMOS.

In view of this, there is another DrMOS structure currently, as shown in FIG. 5. The DrMOS 50 includes a die 51 and a die 52, and the die 52 includes a switching transistor 1 and a switching transistor 2. Because the switching transistor 1 and the switching transistor 2 are prepared in a same die, the switching transistor 1 and the switching transistor 2 are closer to each other. This helps to further reduce an area of the DrMOS 50.

However, because the switching transistor 1 and the switching transistor 2 are prepared in a same die (die 52), preparation processes of the switching transistor 1 and the switching transistor 2 need to be compatible with each other. This in turn increases process development costs and limits type selection of the switching transistor 1 and the switching transistor 2.

For example, preparation processes of a laterally diffused metal oxide semiconductor (LDMOS) transistor and a split gate trench metal oxide semiconductor (SGT MOS) transistor cannot be compatible with each other. In this case, it is quite difficult to prepare both an LDMOS transistor and an SGT MOS transistor in one die. For the DrMOS 50 shown in FIG. 5, it is quite difficult to prepare both the LDMOS transistor and the SGT MOS transistor in the die 52.

In view of this, an embodiment of this disclosure provides a new DrMOS structure. This not only helps to reduce a loss, costs, and an area of a DrMOS, but also helps to reduce type selection limitation on a switching transistor in the DrMOS.

Figure 6:
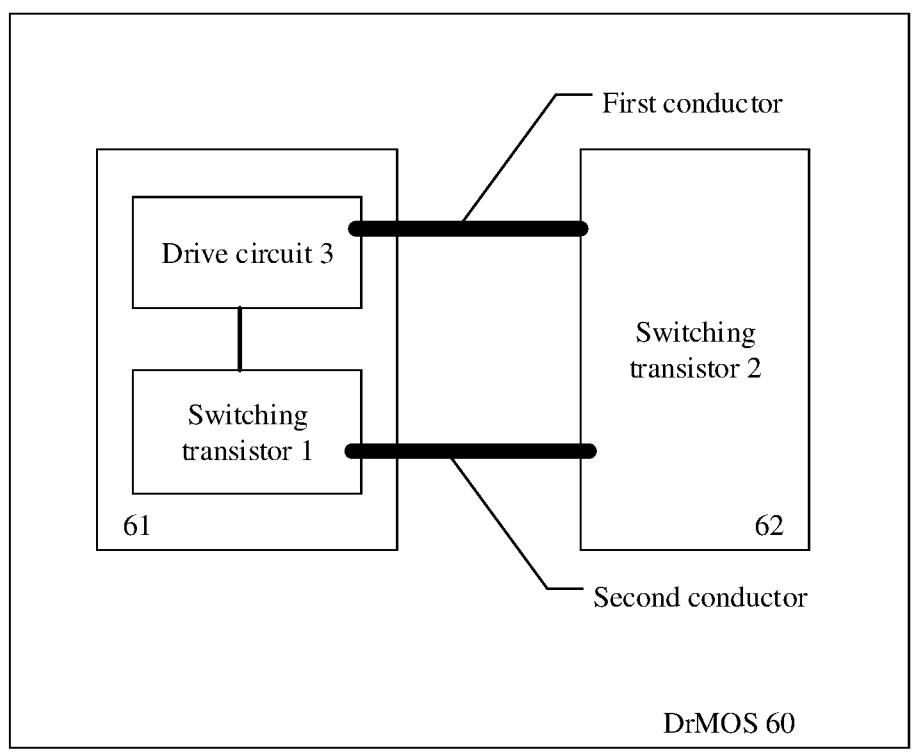
FIG. 6 is a schematic diagram of a structure of a DrMOS according to an embodiment of this disclosure.

For example, as shown in FIG. 6, the DrMOS 60 provided in this embodiment of this disclosure mainly includes a die 61 and a die 62. The die 61 includes a drive circuit 3 and a switching transistor 1, and the die 62 includes a switching transistor 2.

In the die 61, the drive circuit 3 is connected to a gate of the switching transistor 1. For example, the drive circuit 3 may be connected to the gate of the switching transistor 1 through a metal cable in the die 61. A process of preparing the die 61 includes a step of preparing the metal cable between the drive circuit 3 and the switching transistor 1. The metal cable between the drive circuit 3 and the switching transistor 1 is located inside the die 61.

Therefore, the die 61 includes the metal cable between the drive circuit 3 and the switching transistor 1, and no additional lead is required to implement the connection between the drive circuit 3 and the first switching transistor 1. This helps to simplify a preparation process of the DrMOS 60 and reduces process costs of the DrMOS 60. This further relieves problems such as parasitic inductance, parasitic capacitance, and parasitic resistance caused by leads, and further helps to reduce a loss of the DrMOS 60. In addition, the drive circuit 3 and the switching transistor 1 are prepared in a same die (the die 61), so that the drive circuit 3 and the switching transistor 1 are closer to each other. This helps to reduce an area of the DrMOS 60.

The switching transistor 1 and the switching transistor 2 are prepared in different dies. Therefore, a problem of preparation process compatibility between the switching transistor 1 and the switching transistor 2 does not need to be considered. This helps to reduce type selection limitation on the switching transistor 1 and the switching transistor 2. Moreover, the drive circuit 3 is connected to the switching transistor 2 through a first conductor, so that the drive circuit 3 can maintain a capability of controlling the switching transistor 2. For example, the first conductor may be a lead, for example, a metal lead such as a copper wire, a gold wire, or a silver wire.

It may be understood that the DrMOS 60 provided in this embodiment of this disclosure may be applied to implementation of a plurality of types of switching power supply circuits. In some switching power supply circuits, for example, the buck circuit shown in FIG. 3, the source of the switching transistor 1 is connected to the drain of the switching transistor 2. Adapted to the buck circuit shown in FIG. 3, as shown in FIG. 6, in the DrMOS 60 provided in this embodiment of this disclosure, a source of the switching transistor 1 may be connected to a drain of the switching transistor 2 through a second conductor.

Figure 7:
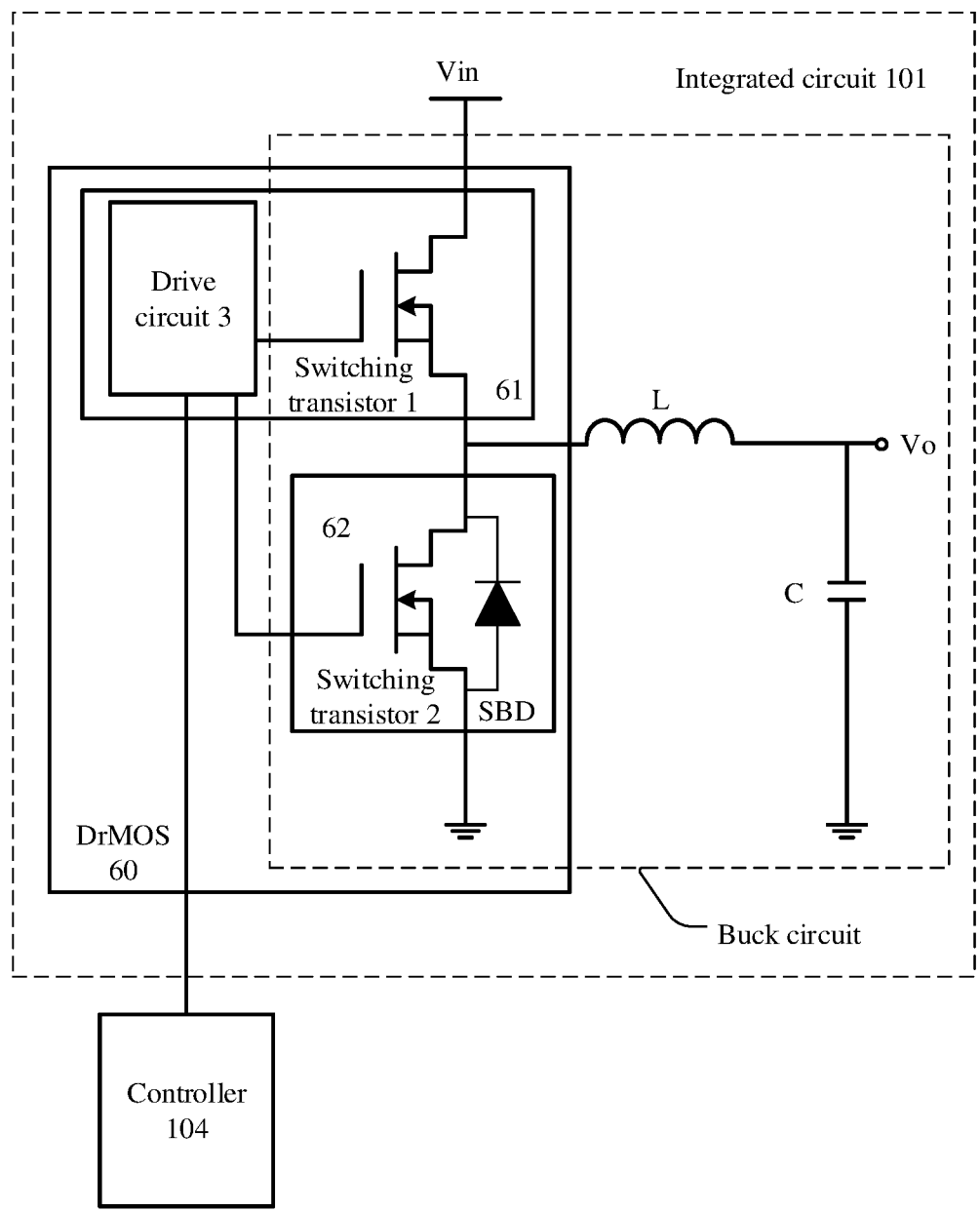
FIG. 7 is a schematic diagram of a structure of a DrMOS according to an embodiment of this disclosure.

Next, the DrMOS 60 provided in this embodiment of this disclosure is further described by using an example in which the DrMOS 60 is in an integrated circuit 101 shown in FIG. 7. In the integrated circuit 101, a buck circuit is used as a switching power supply circuit.

As described above, the switching transistor 1 is switched on in the charging stage and is switched off in the rectification stage. It can be learned from the drive signal 1 shown in FIG. 4 that a switch-on time of the switching transistor 1 is far less than a switch-off time of the switching transistor 1, and a loss generated by the switching transistor 1 is mainly due to a loss generated when the switching transistor 1 is switched on and switched off. This loss is mainly related to a switching speed of the switching transistor 1. Therefore, the switching transistor 1 may be a transistor with a high switching speed. For example, the switching transistor 1 may be an LDMOS transistor.

Figure 8:
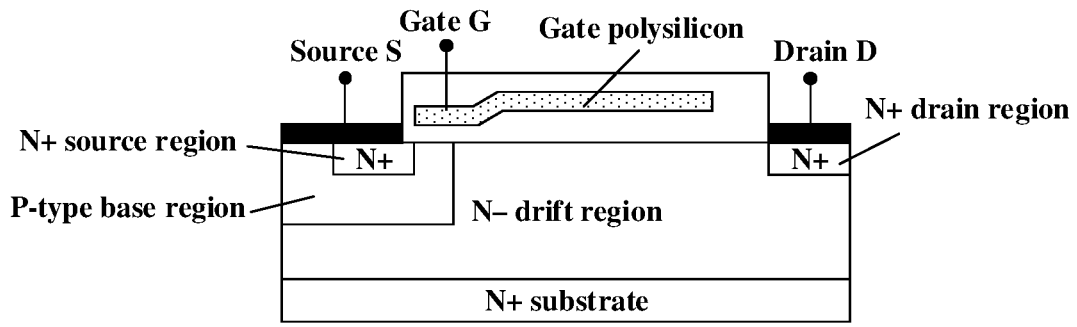
FIG. 8 is a schematic diagram of a structure of an LDMOS transistor.

For example, a structure of the LDMOS transistor may be shown in FIG. 8. The LDMOS mainly includes a substrate, a drift region, a source region, a drain region, and gate polysilicon. The substrate is high-concentration N-type doped (N+). The drift region is located on a surface of the substrate, and is low-concentration N-type doped (N−). In a region that is in the drift region and that is far from the substrate, a base region and a drain region are prepared. The base region is P-type doped, and the drain region is high-concentration N-type doped (N+). The base region and the drain region are isolated from each other by the drift region. A source region is further prepared in a region that is in the base region and that is far from the substrate, and the source region is high-concentration N-type doped (N+). A source S is prepared on a surface of the source region, a drain D is prepared on a surface of the drain region, the gate polysilicon is prepared between the source S and the drain D, and a gate G may be further prepared on a surface of the gate polysilicon.

A switching speed of the LDMOS transistor is high. Therefore, using the LDMOS as the switching transistor 1 helps to reduce a loss of the switching transistor 1. In addition, the gate, the drain, and the source of the LDMOS are located on a same surface of the LDMOS, so that a preparation process of the LDMOS transistor has high compatibility with a complementary metal oxide semiconductor (CMOS) process, and the LDMOS transistor and the drive circuit 3 may be integrated into a same die (the die 61).

It can be learned from the drive signal 2 shown in FIG. 4 that a switch-on time of the switching transistor 2 is far greater than a switch-off time of the switching transistor 2, and a loss generated by the switching transistor 2 is mainly related to an on-resistance of the switching transistor 2. Therefore, the switching transistor 2 may be a switching transistor with a small on-resistance, for example, may be an SGT MOS transistor.

Figure 9:
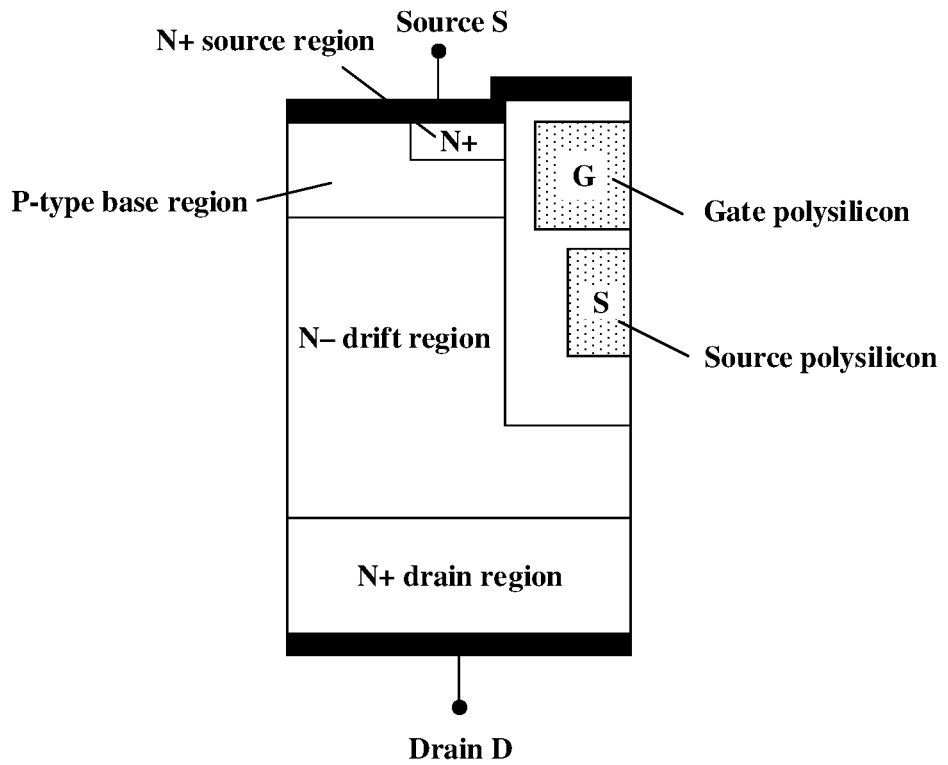
FIG. 9 is a schematic diagram of a structure of an SGT MOS transistor.

For example, a structure of the SGT MOS transistor may be shown in FIG. 9. The SGT MOS transistor mainly includes a drain region, a drift region, a source region, gate polysilicon, source polysilicon, and a base region. The drain region is high-concentration N-type doped (N+). The drift region is disposed adjacent to the drain region, and is low-concentration N-type doped (N−). The base region is further arranged on a side of the drift region far from the drain region, and the base region is P-type doped. The gate polysilicon and the source polysilicon are further prepared on a side adjacent to the base region and the drift region. The source region is further prepared in a region that is in the base region and that is far from the drain region, and the source region is high-concentration N-type doped (N+). A surface of the drain region is further provided with a drain D, and a surface of the source region is further provided with a drain S.

An on-resistance of the SGT MOS transistor is small. Therefore, using the SGT MOS transistor as the switching transistor 2 helps to reduce a loss of the switching transistor 2. It can be learned from FIG. 8 and FIG. 9 that one surface of an SGT MOS transistor is a source, and the other surface thereof is a drain, while a source and a drain of an LDMOS transistor are located on a same surface, and the other surface opposite to the surface is a substrate. Due to different relative position relationships between the source and the drain, a preparation process of the SGT MOS transistor is hardly compatible with a preparation process of the LDMOS transistor. In this embodiment of this disclosure, the SGT MOS transistor and the LDMOS transistor may be located in different dies. Therefore, a compatibility problem between the preparation process of the SGT MOS transistor and the preparation process of the LDMOS transistor can be avoided.

Figure 10:
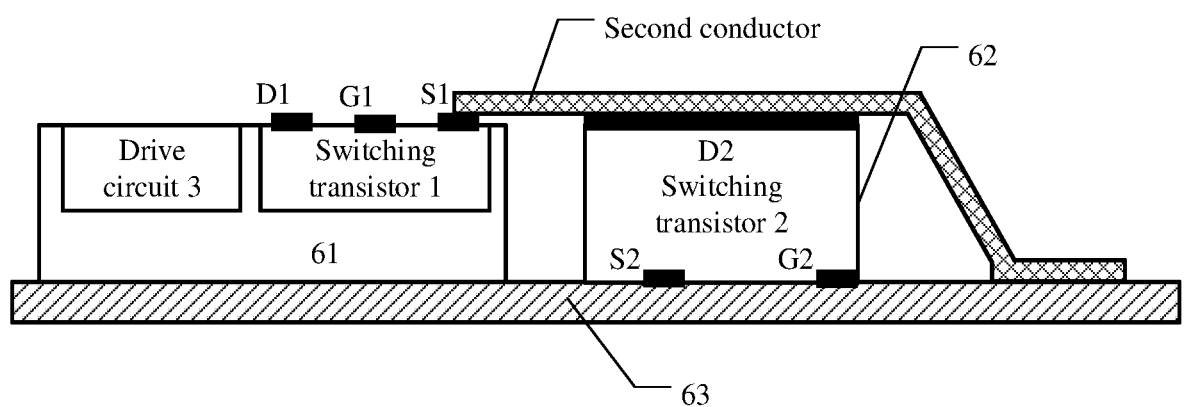
FIG. 10 is a schematic diagram of a structure obtained through side cutting of a DrMOS according to an embodiment of this disclosure.

When a switching transistor 1 is an LDMOS transistor, and a switching transistor 2 is an SGT MOS transistor, the switching transistor 2 may be disposed by using a flip chip structure. Specifically, as shown in FIG. 10, usually, a DrMOS 60 may further include a substrate 63, and the substrate 63 may carry a die 61 and a die 62.

The die 61 and the die 62 are fastened onto the substrate 63. A first surface of the die 1 is disposed away from the substrate 63. The first surface may be a surface on which a source S1 of a switching transistor 1 in the die 1 is located. A second surface of the die 2 is disposed away from the substrate 63, and the second surface may be a surface on which a drain D2 of a switching transistor 2 in the die 2 is located, and a source S2 of the switching transistor 2 is in contact with the substrate 63. The source S2 of the switching transistor 2 is grounded through a metal wire on the substrate 63. The drain D2 of the switching transistor 2 may be connected to the source S1 of the switching transistor 1 through a second conductor.

For example, the second conductor may be a lead or a conductor clip. As shown in FIG. 10, the second conductor is a conductor clip, and the conductor clip may be understood as a metal plate having a bent structure; a first side of the conductor clip is connected to the source S1 of the switching transistor 1; the conductor clip covers the drain D2 of the switching transistor 2, and is bent toward the substrate 63 on a side of the drain D2 away from the source S1; a second side that is of the conductor clip and that is opposite to the first side is bent toward the substrate 63, and the second side is fastened to the substrate 63. The second side of the conductor clip may be used as one of connection ends at which the DrMOS 60 is connected to another component. For example, in a buck circuit, the second side of the conductor clip may be used to connect an inductor L. Because the conductor clip has a larger current transmission cross section compared with a lead, a transmission loss of a current between the source S1 of the switching transistor 1 and the drain D2 of the switching transistor 2 can be reduced.

To further reduce a loss of the DrMOS 60, in a possible implementation, the die 62 may further integrate a Schottky barrier diode (SBD). As shown in FIG. 7, the die 62 may further include an SBD. An anode of the SBD is connected to a source of the switching transistor 2, and a cathode of the SBD is connected to the drain of the switching transistor 2.

The SBD has a low conduction voltage drop VF and a small reverse recovery charge Qrr. This helps to further reduce a loss of the die 62. The conduction voltage drop VF is used as an example. As shown in FIG. 4, there is a dead time between a charging stage and a rectification stage due to a specific delay between switch-on and switch-off of a switching transistor. The switching transistor 2 is not fully switched on during the dead time. In this case, a current may be transmitted through the SBD in parallel with the switching transistor 2. Because a conduction voltage drop VF of the SBD is low, this helps to reduce a loss generated in a process in which the SBD transmits the current, helping to further reduce the loss of the die 62.

It may be understood that, in addition to a drive circuit 3, the switching transistor 1, and the switching transistor 2, another structure may be integrated into the DrMOS provided in this embodiment of this disclosure, to implement more functions. For example, the DrMOS may further include a temperature sensor, and an external component (for example, a controller 104) may obtain temperature information of the DrMOS by using the temperature sensor. For example, the temperature sensor may be located in the die 61 or the die 62, or may be disposed independently of the die 61 and the die 62. This is not limited in this embodiment of this disclosure.

For another example, the DrMOS may further include a current sensor, and an external component (for example, the controller 104) may detect, by using the current sensor, a magnitude of a current flowing through the switching transistor 1 when the switching transistor 1 switched on. For example, the current sensor may be integrated in the die 61.

Figure 11:
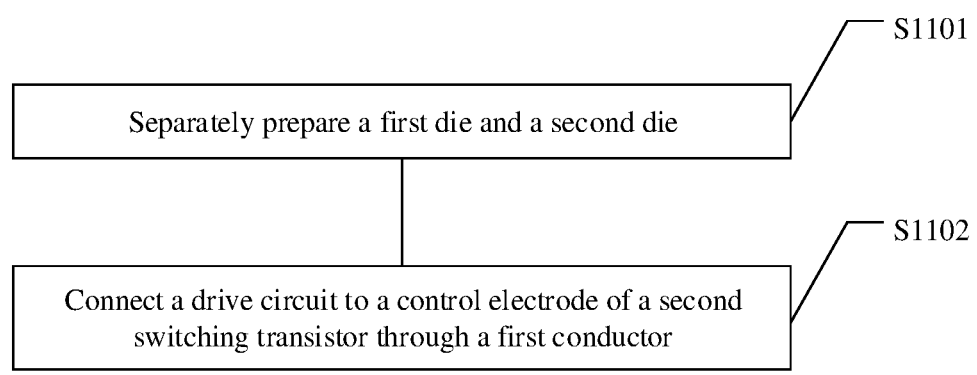
FIG. 11 is a schematic flowchart of a DrMOS preparation method according to an embodiment of this disclosure.

Based on a same technical concept, an embodiment of this disclosure further provides a DrMOS preparation method. The method may be used to prepare the DrMOS provided in any of the foregoing embodiments. For example, as shown in FIG. 11, the DrMOS preparation method mainly includes the following steps:

S1101: Separately prepare a first die and a second die. The first die includes a drive circuit and a first switching transistor, the drive circuit is connected to a gate of the first switching transistor, and the second die includes a second switching transistor. It should be understood that the drive circuit and the gate of the first switching transistor may be connected to each other by using a metal cable in the first die. For example, the first die may be prepared by using a bipolar junction transistor-complementary metal oxide semiconductor-diffused metal oxide semiconductor (BCD) process, so that the first die may integrate the drive circuit and the first switching transistor, and the drive circuit is connected to the gate of the first switching transistor. The second switching transistor may also be prepared by using the BCD process. This is not limited in this embodiment of this disclosure.

S1102: Connect the drive circuit to a gate of the second switching transistor through a first conductor.

In some switching power supply circuits, a source of the first switching transistor may also be connected to a drain of the second switching transistor. In this case, the source of the first switching transistor in the first die may also be connected to the drain of the second switching transistor in the second die by using a second conductor. In this way, the DrMOS can adapt to this type of switching power supply circuit.

A buck circuit is used as an example. In this embodiment of this disclosure, the first switching transistor may be used as a driving switching transistor in the buck circuit, and the second switching transistor may be used as a rectifier switching transistor in the buck circuit. In this case, the first switching transistor may be implemented by a transistor with a high switching speed. For example, the first switching transistor may be an LDMOS transistor. The second switching transistor may be implemented by a transistor with a small on-resistance. For example, the second switching transistor may be an SGT MOS transistor.

When the DrMOS is used in the buck circuit, in the DrMOS, the source of the first switching transistor needs to be connected to the drain of the second switching transistor. Specifically, after S1101 is performed, the first die and the second die may be first fastened onto a same surface of a substrate, and then S1102 is performed to connect the drive circuit to the gate of the second switching transistor by using the first conductor.

During fastening of the first die, a first surface of the first die may be disposed away from the substrate, and the first surface may be a surface on which a source of the first switching transistor (LDMOS transistor) is located. During fastening of the second die, a second surface of the second die may be disposed away from the substrate, and the second surface may be a surface on which the drain of the second switching transistor (SGT MOS transistor) is located. Further, the source of the first switching transistor may be directly connected to the drain of the second switching transistor through the second conductor. The second conductor may be a lead or a conductor clip. This is not limited in this embodiment of this disclosure.

To further reduce a loss of the second switching transistor, in a possible implementation, the second die may further include a Schottky barrier diode SBD. An anode of the SBD is connected to a source of the second switching transistor, and a cathode of the SBD is connected to the drain of the second switching transistor. The SBD has a low conduction voltage drop VF and a small reverse recovery charge Qrr. This helps to reduce a loss of the second switching transistor generated in a dead time.

Based on a same technical concept, an embodiment of this disclosure further provides an integrated circuit. The integrated circuit may include the DrMOS provided in any one of the foregoing embodiments. For example, the integrated circuit may be the integrated circuit 101 shown in FIG. 8. In addition to the DrMOS 60 provided in this embodiment of this disclosure, the integrated circuit may include an inductor L and a capacitor C. A switching transistor 1 and a switching transistor 2 in the DrMOS 60, the inductor L, and the capacitor C may form a buck circuit. One end of the inductor L is connected to a source of the switching transistor 1, the other end of the inductor L is connected to one end of the capacitor C, the other end of the inductor L is configured to output an output voltage Vo, and a source of the switching transistor 2 and the other end of the capacitor C are grounded.

It is clear that a person skilled in the art can make various modifications and variations to this disclosure without departing from the scope of this disclosure. This disclosure is intended to cover these modifications and variations of this disclosure provided that they fall within the scope of protection defined by the following claims and their equivalent technologies.

What is claimed is:

1. A driver metal-oxide-semiconductor field-effect transistor (DrMOS) comprising: a first die and a second die, wherein
   the first die comprises a drive circuit and a first switching transistor, and the drive circuit is connected to a gate of the first switching transistor;
   the second die comprises a second switching transistor, and the drive circuit is connected to a gate of the second switching transistor through a first conductor; and
   a substrate, and the substrate is configured to carry the first die and the second die; wherein
   a source and the gate of the second switching transistor are in contact with the substrate; and
   the first switching transistor is a laterally diffused metal oxide semiconductor LDMOS transistor, and the second switching transistor is a split gate trench metal oxide semiconductor SGT MOS transistor.

2. The DrMOS according to claim 1, wherein a source of the first switching transistor is connected to a drain of the second switching transistor through a second conductor.

3. The DrMOS according to claim 1, wherein at least part of the DrMOS is configured in a buck circuit, the first switching transistor is a drive switching transistor in the buck circuit, and the second switching transistor is a rectifier switching transistor in the buck circuit.

4. The DrMOS according to claim 1, wherein:
   a first surface of the first die is disposed away from the substrate, and the first surface is a surface that is in the first die and on which a source of the first switching transistor is located;
   a second surface of the second die is disposed away from the substrate, and the second surface is a surface that is in the second die and on which a drain of the second switching transistor is located;
   the source of the first switching transistor is connected to the drain of the second switching transistor through the second conductor;
   the first surface of the first die is on an opposite side of the first die as another surface of the first die, and the another surface of first die is in contact with the substrate; and
   the second surface of the second die is on an opposite side of the second die as another surface of the second die, and the another surface of second die is in contact with the substrate.

5. The DrMOS according to claim 3, wherein the second die further comprises a Schottky barrier diode (SBD), an anode of the SBD is connected to the source of the second switching transistor, and a cathode of the SBD is connected to a drain of the second switching transistor.

6. The DrMOS according to claim 1, wherein the DrMOS further comprises a temperature sensor and/or a current sensor.

7. An integrated circuit comprising the DrMOS according to claim 1.

8. The integrated circuit according to claim 7, wherein the integrated circuit further comprises an inductor and a capacitor; and
   one end of the inductor is connected to a source of the first switching transistor, the other end of the inductor is connected to one end of the capacitor, the other end of the inductor is configured to output an output voltage, and a source of the second switching transistor and the other end of the capacitor are grounded.

9. An electronic device comprising: an integrated circuit comprising the DrMOS according to claim 1.

10. A driver metal-oxide-semiconductor field-effect transistor (DrMOS) preparation method comprising:
   separately preparing a first die and a second die, wherein the first die comprises a drive circuit and a first switching transistor, the drive circuit is connected to a gate of the first switching transistor, and the second die comprises a second switching transistor; and
   connecting the drive circuit to a gate of the second switching transistor through a first conductor;
   fastening the first die and the second die onto a surface of a substrate such the substrate carries the first die and the second die; wherein
   a source and the gate of the second switching transistor are in contact with the substrate; and
   wherein the first switching transistor is a laterally diffused metal oxide semiconductor LDMOS transistor, and the second switching transistor is a split gate trench metal oxide semiconductor SGT MOS transistor.

11. The method according to claim 10, wherein the method further comprises:
   connecting a source of the first switching transistor to a drain of the second switching transistor through a second conductor.

12. The method according to claim 10, wherein a DrMOS is used in a buck circuit, the first switching transistor is a drive switching transistor in the buck circuit, and the second switching transistor is a rectifier switching transistor in the buck circuit.

13. The method according to claim 10, wherein
before the connecting the drive circuit to the gate of the second switching transistor through a first conductor:
the first die and the second die are fastened onto the surface of the substrate, wherein a first surface of the first die is disposed away from the substrate, the first surface is a surface that is in the first die and on which a source of the first switching transistor is located, a second surface of the second die is disposed away from the substrate, and the second surface is a surface that is in the second die and on which a drain of the second switching transistor is located; and
the method further comprises connecting the source of the first switching transistor to the drain of the second switching transistor through the second conductor
the first surface of the first die is on an opposite side of the first die as another surface of the first die, and the another surface of first die is in contact with the substrate; and
the second surface of the second die is on an opposite side of the second die as another surface of the second die, and the another surface of second die is in contact with the substrate.

14. The method according to claim 12, wherein the second die further comprises a Schottky barrier diode (SBD), an anode of the SBD is connected to the source of the second switching transistor, and a cathode of the SBD is connected to a drain of the second switching transistor.

15. The method according to claim 10, wherein the separately preparing of the first die and the second die comprises:
preparing the first die and/or the second die by using a bipolar junction transistor-complementary metal oxide semiconductor-diffused metal oxide semiconductor (BCD) process.

16. The DrMOS according to claim 1, further comprising:
a current sensor and a controller; wherein:
the controller is configured to detect, by using the current sensor, a magnitude of a current flowing through the first switching transistor when the first switching transistor is switched on; and
the current sensor is integrated in the first die.

17. The DrMOS according to claim 1, wherein:
a drain of the first switching transistor is configured to receive an input voltage;
a source of the first switching transistor is connected to a drain of the second switching transistor; and
the source of the second switching is grounded.

18. The DrMOS according to claim 1, wherein:
the SGT MOS transistor is fastened onto a surface of the substrate by using a flip chip structure.

19. The method according to claim 10, wherein the method further comprises:
fastening the SGT MOS transistor onto a surface of the substrate by using a flip chip structure.

* * * * *